United States Patent [19]

Shin et al.

[11] Patent Number: 5,610,865
[45] Date of Patent: Mar. 11, 1997

[54] SEMICONDUCTOR MEMORY DEVICE WITH REDUNDANCY STRUCTURE

[75] Inventors: Choong-Sun Shin, Seoul; Young-Sik Seok, Suwon, both of Rep. of Korea

[73] Assignee: Samsung Electronics Co., Ltd., Suwon, Japan

[21] Appl. No.: 480,785

[22] Filed: Jun. 7, 1995

[30] Foreign Application Priority Data

Jun. 8, 1994 [KR] Rep. of Korea .................. 12846/1994

[51] Int. Cl.⁶ ...................................................... G11C 7/00
[52] U.S. Cl. .......................... 365/200; 365/225.7; 365/96
[58] Field of Search ................................ 365/200, 225.7, 365/96

[56] References Cited

U.S. PATENT DOCUMENTS 5,383,156  1/1995  Komatsu ................................. 365/200
5,426,607  6/1995  Ishibashi ................................ 365/200

*Primary Examiner*—David C. Nelms
*Assistant Examiner*—Vu A. Le
*Attorney, Agent, or Firm*—Cushman Darby & Cushman IP Group of Pillsbury Madison & Sutro LLP

[57] ABSTRACT

A semiconductor memory device with redundancy structure having a normal memory cell array having a plurality of normal memory cells arranged in row and column directions and a redundant memory cell array having a plurality of redundant memory cells, includes a redundant column selecting circuit for comparing an externally applied column address signal and a programmed defective column address signal to generate a redundant column selection signal. The redundant column selecting circuit has a programming circuit portion for producing the programmed defective column address signal by programming a defective column address corresponding to a defective column. A decoding circuit is provided for decoding the column address signals and producing a column decoding signal; and a normal column selecting circuit for receiving the column decoding signal and producing a normal column selection signal, and which has a disabling circuit for disabling the normal column selecting circuit and enabling the redundant column selecting circuit when the defective column address is applied. When a redundant column is substituted for a defective column with the present invention, since the normal column selection circuit can be operated independently of output signals of fusing boxes provided in a redundant column selection circuit, mal-operation of column and redundant selection circuits can be prevented and the gate passing time of a signal is shortened so as to achieve a high speed operation of the circuits.

9 Claims, 5 Drawing Sheets

SEMICONDUCTOR MEMORY DEVICE WITH REDUNDANCY STRUCTURE

BACKGROUND OF THE INVENTION

1. Field of the Invention

The present invention relates to a semiconductor memory device with repairing structure, and more particularly to a semiconductor memory device with redundancy structure in which a redundant memory cell therein is capable of being substituted for a defective memory cell therein.

2. Description of the Prior Art

As well-known in the art, a redundancy circuit has been used so as to prevent lowering in yield due to a defective memory cell occurring during fabrication of a high integrated semiconductor memory device. Such a redundancy circuit is provided in a normal memory cell array of the memory device. When a defect occurs in a memory cell, one of the redundant memory cells provided on the chip is substituted for the defective memory cell, thereby allowing the memory device to be normally operated. Substitution of a redundant memory cell for a defective memory cell is accomplished by the following method.

In detail, a row or column line corresponding to a defective memory cell is electrically or physically isolated from normal memory cells, and a redundant row line or a redundant column is electrically connected to a row decoder or a column decoder. The above substitution is generally performed directly before or after packaging a memory chip.

Column redundancy circuit is provided to substitute a redundant column for at least one of the defective columns corresponding to the defective memory cells, and has a redundant column selection circuit for disabling the defective columns and enabling redundant columns when the same column address as a programmed column address is applied. The programmed column address is set by a fusing circuit for programming a column address corresponding to the defective column.

Referring to FIG. 1, a conventional column redundancy circuit is broadly constituted by a redundant column selection circuit portion (hereinafter, referred to as "RCS circuit portion") 200 and a normal column selection circuit portion (hereinafter, referred to as "NCS circuit portion") 300. The RCS circuit portion 200 has a plurality of fusing boxes 2, 4, 6 for receiving column address signals CAa/ $\overline{CAa}$, CAb/ $\overline{CAb}$, ..., CAn/ $\overline{CAn}$, a plurality of inverter chains I1–I8, I1–I8, I1–I8 for delaying output signals FBO1, FBO2, ..., FBON of the fusing boxes for a predetermined time, respectively, and producing redundant column selection signals RCS1, RCS2, ..., RCSN, a plurality of NOR gates 8, ..., 10 for receiving the output signals of the fusing boxes, NAND gate 12 for receiving all of the output signals of the NOR gates and an inverter 14 for generating a normal disable signal NCD by inverting the output signal of the NAND gate 12. The NCS circuit portion 300 has NAND gate 32 for receiving column address signal CAa, CAb, NAND gate 34 for receiving column address signal CAi, CAj, NAND gate 36 for receiving column address signal CAk, CAl, NAND gate 38 for receiving column address signal CAm, CAn, and a plurality of inverter chains I1–I5, I1–I5, I1–I5 for delaying output signals of the NAND gates 32, 34, 36, 38, respectively. Each of the fusing boxes serves as a programming means.

In FIG. 1, NAND gates 16 and 18, the NAND gates 32, 34, 36 and 38, and the plurality of inverter chains I1 through I5 constitute a column decoder. Column decoding signals DCAij, DCAkl and DCAmn are applied to the input of the NAND gate 18. The NAND gate 16 receives the normal disable signal NCD and the output signal (e.g. the signal of a node "A" shown in FIG. 1) of the inverter chain corresponding to the NAND gate 32, and generates a column decoding signal DCAab. Also, the circuit portion 300 further comprises p type MOS (hereinafter, referred to as "PMOS") transistor 20 having a gate terminal for receiving the column decoding signal DCAab, PMOS and n type MOS (hereinafter, referred to as "NMOS") transistors 22 and 24 each having a gate terminal for receiving the output signal of the NAND gate 18, PMOS transistor 26 having a gate terminal for receiving the column decoding signal DCAab and a drain terminal connected to an output node "B", inverter 28 for inverting the signal of the output node "B" and inverter 30 for inverting the output signal of the inverter 28 and producing a normal column selection signal NCS.

FIG. 2 illustrates the detailed construction of the fusing box shown in FIG. 1. In FIG. 2, the fusing box has an inverter 40, a plurality of NMOS transistors T1, T1', T2, T2', ..., TN, TN', a plurality of fuses F1, F1', F2', ..., FN, FN' capable of being switched, a plurality of NAND gates 48, ..., 50 for receiving input signals responsive to each fusing state and producing an output signal, and NOR gate 52 for receiving output signals of the NAND gates and producing an output signal FBO of the fusing box. Each of the NMOS transistors has a gate terminal for commonly receiving a control signal RE, a first channel terminal for receiving a column address signal CAa, $\overline{CAa}$, CAb, $\overline{CAb}$, ..., CAn, $\overline{CAn}$, and a second channel terminal connected to one of the fuses. The fusing box further comprises a plurality of NMOS transistors 42, 44, 46 each having a gate terminal for receiving the output signal of the inverter 40, a drain terminal connected commonly to output terminals of the fuses F1 and F1', F2 and F2', ..., FN and FN'. Each of the NMOS transistors 42, 44, 46 functions as a discharging transistor.

The fusing box of FIG. 2 is a circuit for programming a column address corresponding to a defective column. In FIG. 2, if the control signal RE is at the low level, all the NMOS transistors 42, 44, 46 are on and then a discharging operation occurs in each drain terminal thereof, thereby allowing the output signal FBO of the fusing box to be set to the low level. However, substitution of a redundant column for a defective column is accomplished by enabling the control signal RE to be the high level and electrically cutting a fuse connected to a column address input terminal not corresponding to a defective column address. After completion of the substitution, the defective column address corresponding to the defective column is applied to the input of the NAND gates 48, ..., 50 and then is changed to the high level, thereby allowing the output signal FBO of the NOR gate 52 to be at the high level. Therefore, in the fusing box of FIG. 2, only when a defective column address is applied, the output signal FBO of the fusing box is set to be at the high level. This fusing box is usually called "NAND type fusing box". Programming of column address in the fusing box is accomplished by cutting (or fusing) a fuse connected to a column address input terminal not corresponding to a defective column address of the column address signals. It will be readily understood by those skilled in the art that, in the well-known NOR type fusing box different from the NAND type fusing box, programming of column address is accomplished by cutting a fuse connected to a column address input terminal corresponding to a defective column address. As shown in FIG. 1, because the RCS circuit portion 200 has a plurality of fusing boxes, e.g.

a first fusing box 2, a second fusing box 4, ... , an N-th fusing box 6, it can program defective column addresses corresponding to the N number of defective columns.

Hereinafter, operation of the normal and redundant column selection circuit portions is described in detail with reference to FIGS. 1 and 2.

First, in case that an external column address not corresponding to a defective column is applied, the column address signal CAa, $\overline{CAa}$, CAb, $\overline{CAb}$, ... , CAn, and $\overline{CAn}$ applied to the RCS circuit portions 200 are compared with defective column address signals programmed in the fusing boxes. If two comparing signals are identical, all the fusing boxes 2, 4, ... , 6 are set to generate the output signals FBO1, FBO2, ... , FBON of low level. As a result, all of the redundant column selection signals RCS1, RCS2, ... , RCSN are at the low level and thereby the redundant columns are not selected. Since the output signals FBO1, FBO2, ... , FBON also are at the low level, output signals of the NOR gates 8, ... , 10 are at the high level and thereby a normal column disable signal NCD of the high level is generated from the inverter 14. On the basis of the normal column disable signal NCD and a signal of the node "A" applied to input terminals of the NAND gate 16, a column decoding signal DCAab is generated from the NAND gate 16. The column decoding signals DCAij, DCAkl, DCAmn produced in responsive to the column address CAi, CAj, CAk, CAl, CAm, CAn are applied to three input terminals of the NAND gate 18. Therefore, the transistors 20, 22, 24, 26 are controlled in accordance with the column decoding signal DCAab and the output signal of the NAND gate 18 and thus the normal column selection signal NCS capable of selecting a normal column is generated.

On the other hand, when an external column address corresponding to a defective column is applied, the column address signals CAa, $\overline{CAa}$, CAb, $\overline{CAb}$, ... , CAn, and $\overline{CAn}$ applied to the RCS circuit portions 200 are compared to defective column address signals programmed in the fusing boxes. If the external column address is identical to the defective column address programmed in one of the fusing boxes 2, 4, ... , 6, for example the defective column address programmed in the first fusing boxes 2, the first fusing boxes 2 is enabled to generate the output signal FBO1 of the high level. As a result, the redundant column selection signal RCS1 is at the high level and thereby the redundant column can be substituted for the defective column. If the external column address is identical with defective address programmed in two fusing boxes, for example the first and second fusing boxes 2, 4, the first and second fusing boxes 2, 4 are enabled to generate the output signals FBO1, FBO2 of the high level. As a result, the redundant column selection signals RCS1, RCS2 are at the high level and thereby the redundant columns can be substituted for the defective columns. Also, the normal column disable signal NCD is at the low level and the normal column selection signal NCS also is at the low level.

As described above, in the column selection circuit portions 200 and 300 of FIG. 1, when an external defective column address corresponding to a defective column is applied, the first fusing box 2 is enabled to produce the output signal FBO1 of the high level and the normal column disable signal NCD is changed to the low level in response to the level of the output signal FBO1. Then, even if the node "A" is at the high level, the normal column selection signal NCS is at the low level owing to the low level of the normal column disable signal NCD and thereby the defective column is not selected.

The conventional column redundancy circuit of FIG. 1 has a structural feature that the normal column disable signal NCD for selecting a defective column is determined by the combination of signals FBO1, FBO2, ... , FBON from the fusing boxes provided in the RCS circuit portion 200. In the case of this structural feature, since the normal column disable signal NCD is generated after passing through the NOR gate 8, ... , 10, the NAND gate 12 and the inverter 14, the column redundancy circuit requires a gate passing time necessary for passing through the gates. Because of this gate passing time, there is a problem that, if the node "A" is maintained at the high level before the normal column disable signal NCD is changed to the low level, the conventional column redundancy circuit may be frequently real-operated due to a glitch occurring when the normal column selection signal NCS is maintained at the high level for a short time directly before setting the normal column disable signal NCD to the low level. Therefore, a first delay time a signal is passed through the input terminals of the fusing boxes to the node "A" has to be longer than a second delay time a signal is passed through the NAND and NOR gates 48, ... , 50, 52 of the respective fusing box to the logic gates 8, ... , 10, 12 and 14. When the first delay time is longer than the second delay time, the enabling time of the normal column selection signal NCS is dependent on the second delay time even if a defective column address is not applied. To shorten the enabling time of the signal NCS, it is necessary to reduce the number of the gates or shorten the delay time passing through each gate.

As a semiconductor memory device becomes large in scale thereof and high in integration, the number of column address input terminals is increased in proportion. In the conventional column redundancy circuit of FIG. 1, however, it is difficult to reduce the number of gates provided in the fusing box in consideration of the appropriate number of the gates therein. Also, since the number of fusing boxes to be provided in the column redundancy circuit is increased in higher integration of a semiconductor memory device, it is difficult to reduce the number of gates provided between the output terminal of the fusing box and a terminal for producing the normal column disable signal NCS.

SUMMARY OF THE INVENTION

It is an object of the present invention to provide a semiconductor memory device with redundancy structure in which, when a redundant column is substituted for a defective column, a normal column selection circuit portion can be operated independently of output signals of fusing boxes provided in a redundant column selection circuit portion.

It is a further object of the present invention to provide a semiconductor memory device with redundancy structure in which, when a redundant cell is substituted for a defective cell of a normal memory cell array block using block designation information, a normal column selection circuit portion can be operated independently of output signals of fusing boxes provided in a redundant column selection circuit portion.

It is another object of the present invention to provide a semiconductor memory device with redundancy structure which comprises a disabling circuit means, which is provided in a normal column selection circuit portion, for disabling the normal column selection circuit portion and enabling a redundant column selection circuit portion, when a defective column address is applied.

It is an additional object of the present invention to provide a semiconductor memory device with redundancy structure in which real-operation of column and redundant selection circuits can be prevented so as to improve a redundancy efficiency and the gate passing time of a signal is shortened so as to achieve a high speed operation of the circuits.

According to the aspect of one present invention, the semiconductor memory device with redundancy structure having a normal memory cell array having a plurality of normal memory cells arranged in row and column directions and a redundant memory cell array having a plurality of redundant memory cells comprises a redundant column selecting circuit for comparing an externally applied column address signal and a programmed defective column address signal to generate a redundant column selection signal. The redundant column selecting circuit preferably includes a device which produces the programmed defective column address signal by programming a defective column address corresponding to a defective column; a decoder for decoding the column address signals and producing a column decoding signal; and a normal column selecting circuit for receiving the column decoding signal and producing a normal column selection signal. The normal column selecting circuit includes a device for disabling the normal column selecting circuit and enabling the redundant column selecting circuit when the defective column address is applied.

In the semiconductor memory device, the normal column selecting circuit enables the normal column selecting circuit and disables the redundant column selecting circuit when a column address not corresponding to the defective column is applied.

In the semiconductor memory device, the normal column selecting circuit is composed of a fusible fuse.

According to another aspect of the present invention, the semiconductor memory device with redundancy structure having a plurality of normal memory cell array blocks each having a plurality of normal memory cells arranged in row and column directions and a redundant memory cell array having a plurality of redundant memory cells so as to substitute at least one of the redundant memory cells for a defective memory cell block having a defective memory cell comprises a redundant column selecting circuit for receiving an externally applied column address signal and a block designation row address signal and comparing the externally applied column address signal and the block designation row address signal with a programmed defective column address signal and a programmed defective block designation row address signal, respectively, to generate a redundant column selection signal. The redundant column selecting circuit produces the programmed defective column address signal and the programmed defective block designation row address signal by programming a defective column address corresponding to a defective column and a defective block designation row address for designating the defective memory cell array blocks; column decoders for decoding the column address and producing a column decoding signal; row decoders for decoding the row address and producing a block designation row address decode signal; and a normal column selecting circuit for receiving the column decoding signals corresponding to each of the block designation row address decode signal and producing a normal column selection signal normal column selecting circuit is responsive to the defective block designation row address decode signal to disable the normal column selecting circuit and enable the redundant column selecting circuit when the defective column address and the defective block designation row address are applied.

In the semiconductor memory device, the normal column selecting circuit enables said normal column selecting circuit and disables the redundant column selecting circuit, when column address not corresponding to the defective column is applied.

In the semiconductor memory device, the normal column selecting circuit is composed of a fusible fuse.

In accordance with the present invention, when a redundant column is substituted for a defective column, since the normal column selection circuit can be operated independently of output signals of fusing boxes provided in a redundant column selection circuit portion, real-operation of column and redundant selection circuits can be prevented and the gate passing time of a signal is shortened so as to achieve high speed operation of the circuits.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S)

Figure 3:
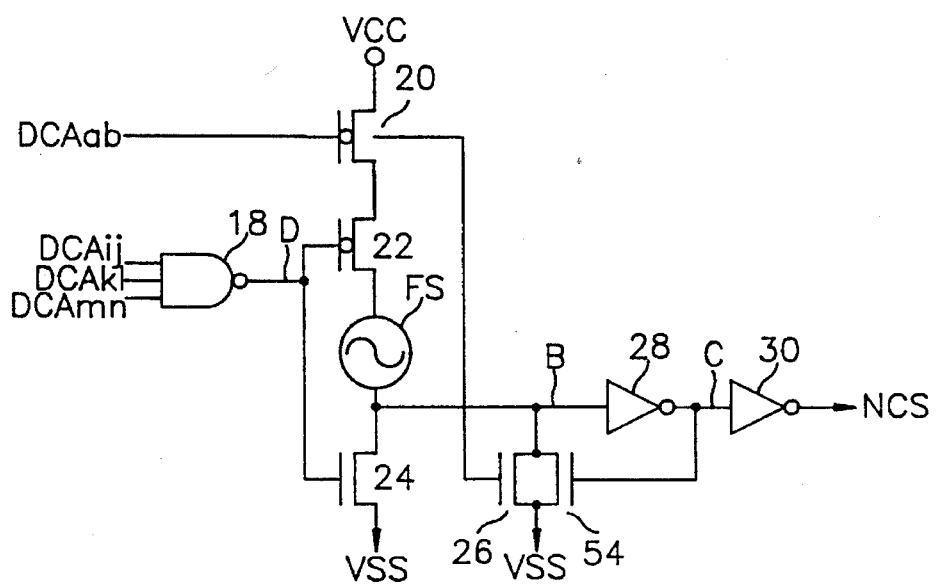
FIG. 3 illustrates the arrangement of the improved normal column selection circuit in accordance with the present invention.

Referring to FIG. 3, the redundancy circuit according to the present invention comprises an NCS (normal column selection) circuit portion which has NAND gate 18 for receiving column decoding signals DCAij, DCAkl and DCAmn, PMOS transistor 20 having a source connected to a source voltage supply VCC and a gate for receiving a column decoding signal DCAab, PMOS transistor 22 having a source connected to a drain of the PMOS transistor 20 and a gate for receiving an output signal of the NAND gate 18, a fuse FS connected between a drain of the PMOS transistor 22 and a node "B", NMOS transistor 24 having a drain connected to the node "B", a source connected to a ground voltage supply VSS and a gate for receiving the output signal of the NAND gate 18, a first inverter 28 for inverting a signal level of the node "B", a second inverter 30 for inverting a signal level of a node "C" connected to the output terminal of the first inverter 28 and producing a normal column selection signal NCS, and a pair of NMOS transistors 26 and 54 connected between the ground voltage supply VSS and the node "B". The column decoding signal DCAab and the signal of the node "C" are applied to gates of the NMOS transistors 26 and 54, respectively.

As shown in FIG. 3, each of NCS circuit portions corresponding to all normal columns has the fuse FS. If a defective column is checked, the NCS circuit portion is disabled by fusing the fuse FS. The fuse FS serves as a disabling means for disabling the NCS circuit portion and is formed of fusible polysilicon. Also, the fuse FS does not need to be located between the PMOS and NMOS transistors 22 and 24. As described above, the NCS circuit portion 300 of the conventional redundancy circuit of FIG. 1 is controlled in response to the combination of output signals of fusing boxes therein, but the NCS circuit portion of the present invention can be controlled by fusing only the fuse FS therein.

Figure 4:
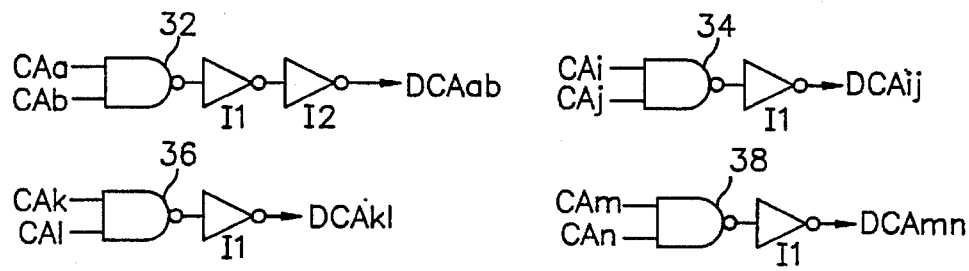
FIG. 4 illustrates the arrangement of the improved column decoder circuit in accordance with the present invention.

FIG. 4 shows the column decoder of the redundancy circuit according to the present invention. In FIG. 4, the column decoding signal DCAab is generated by combination of column address signals CAa and CAb. The column address signals CAa and CAb are applied to input terminals of NAND gate 32 and the output signal of the NAND gate 32 is passed through two inverters I1 and I2 connected in series. As a result, the column decoding signal DCAab is generated from the output terminal of the inverter I2. The column decoding signal DCAij is generated by combination of column address signals CAi and CAj. The column address signals CAi and CAj are applied to NAND gate 34 and the output signal of the NAND gate 34 is passed through an inverter I1, thereby allowing the column decoding signal DCAij to be generated from the inverter I1. Identical with to generation of the column decoding signal DCAkl, the column decoding signals DCAkl and DCAmn are generated by combination of CAk and CAl, CAm and CAn, respectively.

Figure 1:
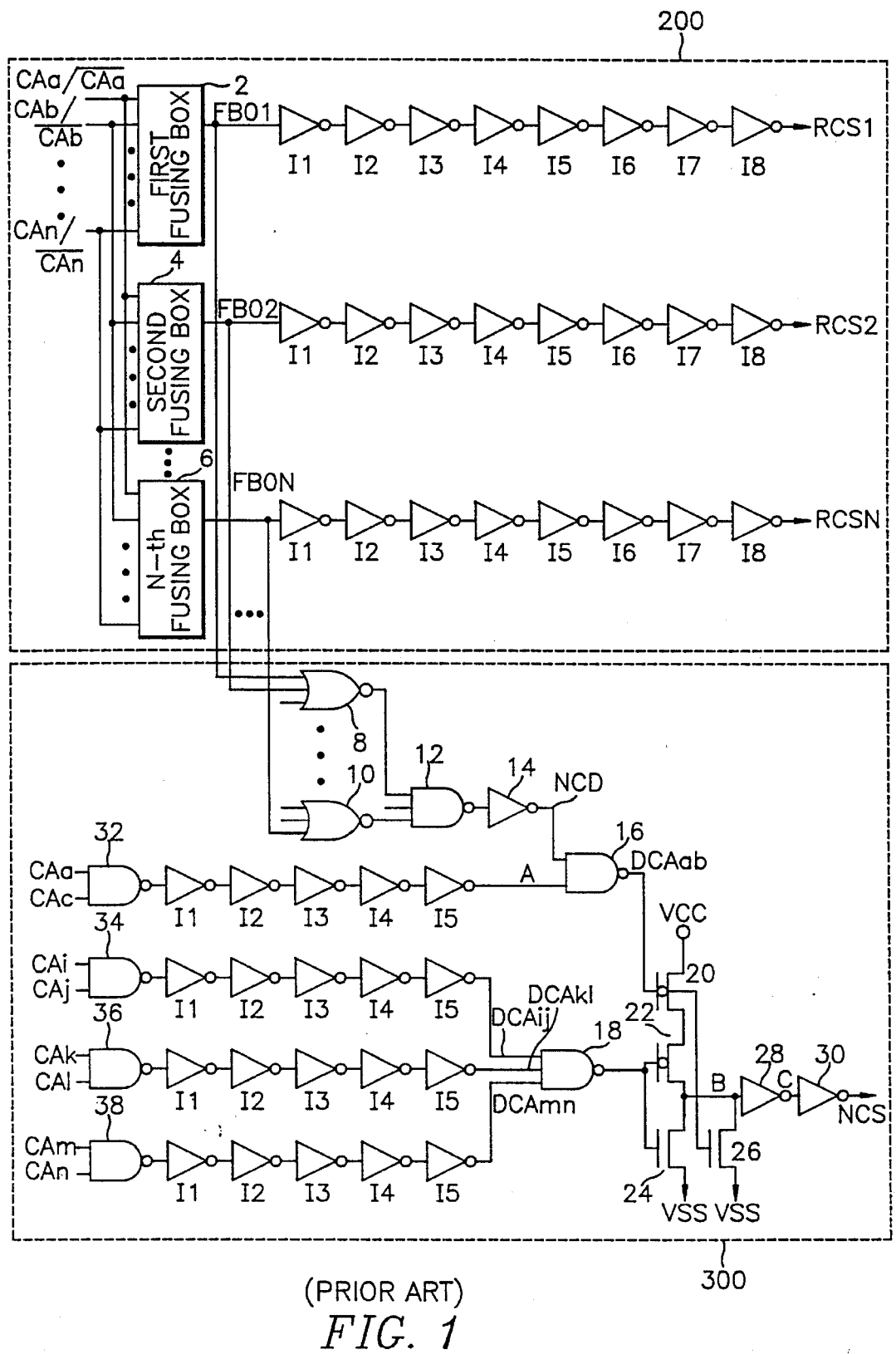
FIG. 1 illustrates the arrangement of a conventional column redundancy circuit.
Figure 2:
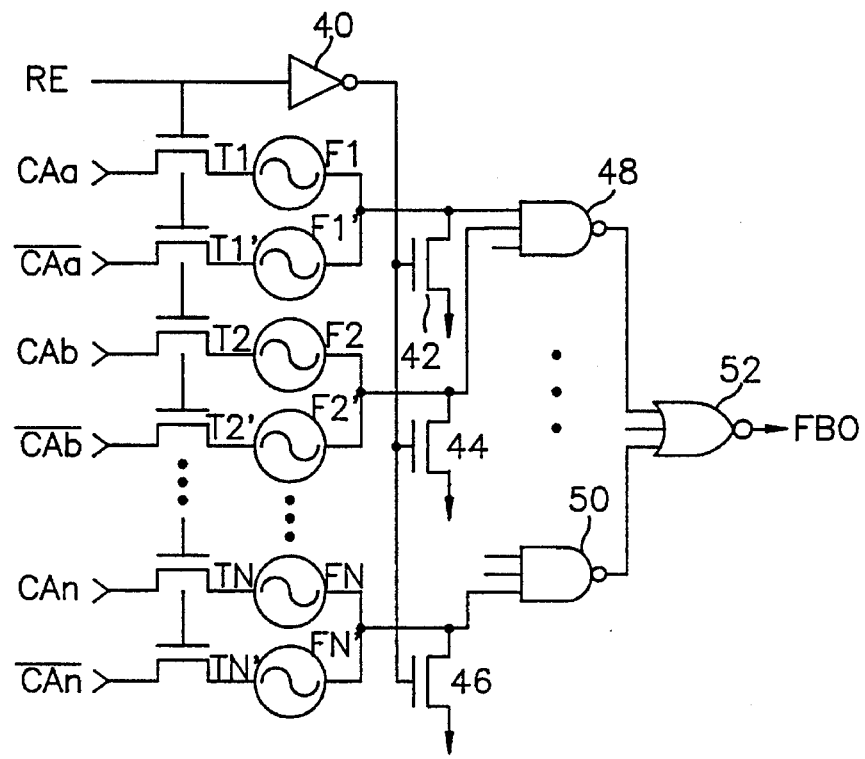
FIG. 2 illustrates a detailed arrangement of the fuse box shown in FIG. 1.
Figure 5:
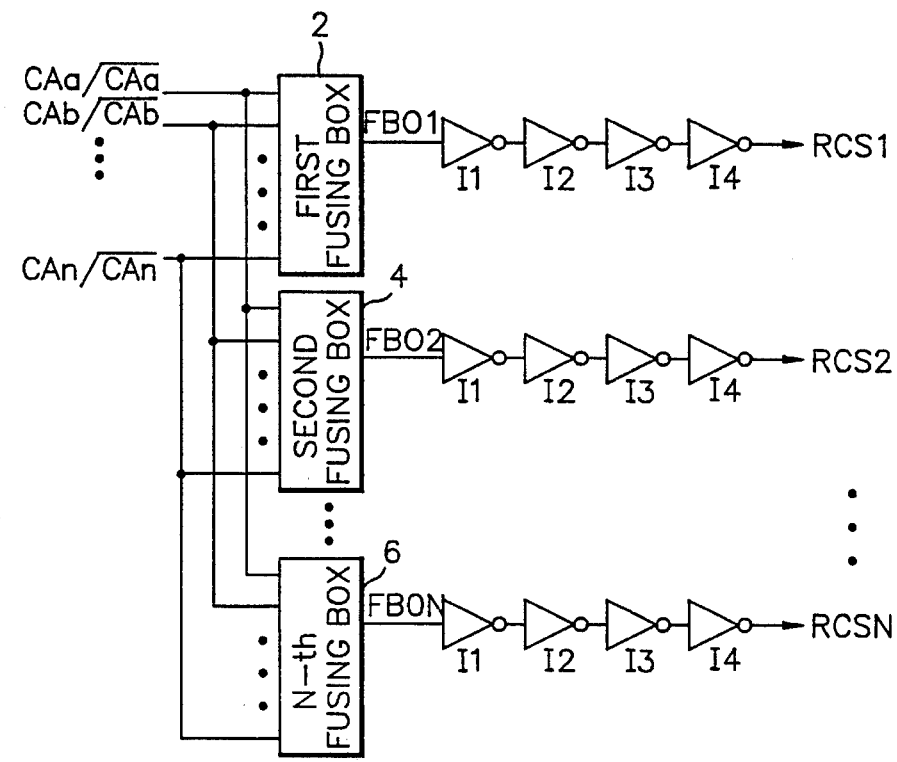
FIG. 5 illustrates the arrangement of the improved redundant column circuit in accordance with the present invention.

With reference to FIG. 5, the RCS (redundant column selection) circuit portion of the redundancy circuit according to the present invention is similar to the construction of that of FIG. 1. Each of fusing boxes 2, 4, . . . , 6 of FIG. 5 has the same construction as that of the fusing box as shown in FIG. 2. In the RCS circuit portion of FIG. 5, however, the number of inserters is significantly reduced as compared with the number of inserters in the RCS circuit portion of FIG. 1.

Hereinafter, the operation of the normal and redundant column selection circuit portions will be described in detail with reference to FIGS. 3 to 5.

To substitute a redundant column for a defective column, a fusing method of the fusing boxes 2, 4, . . . , 6 for programming the defective column address is identical with the conventional method except that, in addition to fusing the fuse of the fusing box corresponding to the defective column, the fuse FS provided in the NCS circuit portion is fused as shown in FIG. 3.

First, to when an external column address not corresponding to a defective column is applied, the fuse FS is not fused because the column designated by the column address signal CAa, $\overline{CAa}$, CAb, $\overline{Cab}$, . . . , CAn, and $\overline{CAn}$ is not the defective column. If the external column address is not applied, the column decoding signal DCAab is maintained at the high level because all the column address signals CAa and CAb are at the low level. Then, all the column decoding signals DCAij, DCAkl, DCAmn are at the low level and thereby the output signal of the NAND gate 18 (e.g. the signal of the node "D") is at the high level. As described above, when the column decoding signal DCAab is at the high level and the column decoding signals DCAij, DCAkl, DCAmn are at the low level, the PMOS transistors 20 and 22 are off and at the same time the NMOS transistors 24 and 26 is on. For this reason, the signals of the nodes "B" and "C" are set to be at the low level and the high level, respectively, and thereby the normal column selection signal NCS of low level is generated. Then, the signal of the node "C" is maintained at the high level and therefore the NMOS transistor 54 is on.

After a predetermined time, if the external column address is applied, the column decoding signal DCAab is maintained at the low level because all the column address signals CAa and CAb are at the high level. Then, all the column decoding signals DCAij, DCAkl, DCAmn are at the high level and thereby the output signal of the NAND gate 18 (e.g. the signal of the node "D") is at the low level. The PMOS transistors 20 and 22 also are on and the NMOS transistor 24 is off. While the NMOS transistor 54 connected to the node "C" is on, the signal of the node "B" is set to be at the high level because the conductance of the transistor 54 is relatively low. Then, the signal of the node "C" is set to be at the low level and thereby the normal column selection signal NCS of high level is generated. Also, since the signal of the node "C" is maintained at the low level, the NMOS transistor 54 is again off. As described above, the NCS circuit portion is enabled to generate the normal column selection signal NCS of the high level. As a result, the normal column is selected. In the RCS circuit portion of FIG. 5. Since the column address not corresponding to the defective column is applied, the fusing box is disabled to produce the output signal FBO of the low level. Then, the redundant column selection signal RCS is maintained at the low level, thereby allowing the redundant column not to be selected.

Hereinafter, the operation of the selection circuit portions will be described in detail in case that an external column address corresponding to a defective column is applied. In this case, the fuse FS provided in the NCS circuit portion is fused because the column designated by the column address signal CAa, $\overline{CAa}$, CAb, $\overline{CAb}$, . . . , CAn, and $\overline{CAn}$ is the defective column. If the external column address is not applied, the column decoding signal DCAab is maintained at the high level because all the column address signals CAa and CAb are at the low level. Then, all the column decoding signals DCAij, DCAkl, DCAmn are at the low level and thereby the output signal of the NAND gate 18 (e.g. the signal of the node "D") is at the low level. As described above, when the column decoding signal DCAab is at the high level and all the column decoding signals DCAij, DCAkl, DCAmn are at the low level, the PMOS transistors 20 and 22 are off and at the same time the NMOS transistors 24 and 26 is on. For this reason, the signals of the nodes "B" and "C" are set to be at the low level and the high level, respectively, and thereby the normal column selection signal NCS of low level is generated. Then, the signal of the node "C" is maintained at the high level and therefore the NMOS transistor 54 is on.

After a predetermined time, if the external column address is applied, the column decoding signal DCAab is maintained at the low level. Thus, the PMOS transistors 20 and 22 are on and at the same time the NMOS transistor 24 is off. However, since the fuse FS is fused and the NMOS transistor 54 is on, the signal of the node "B" is set to be at the low level. Therefore, the signal of the node "C" is set to be at the high level, thereby allowing the normal column selection signal NCS of low level to be generated. As a result, the normal column is not selected.

Also, since the defect column address is applied to the RCS circuit of FIG. 5, at least one of the fusing boxes 2, 4, ..., 6 is enabled to generate the output signal FBO1, FBO2, ..., FBON of high level. Then, at least one of the redundant column selecting signals RCS1, RCS2, ..., RCSN is set to be a low level, thereby allowing the redundant column to be selected. As a result, the selected redundant column can be substituted for the defective column.

Figure 6:
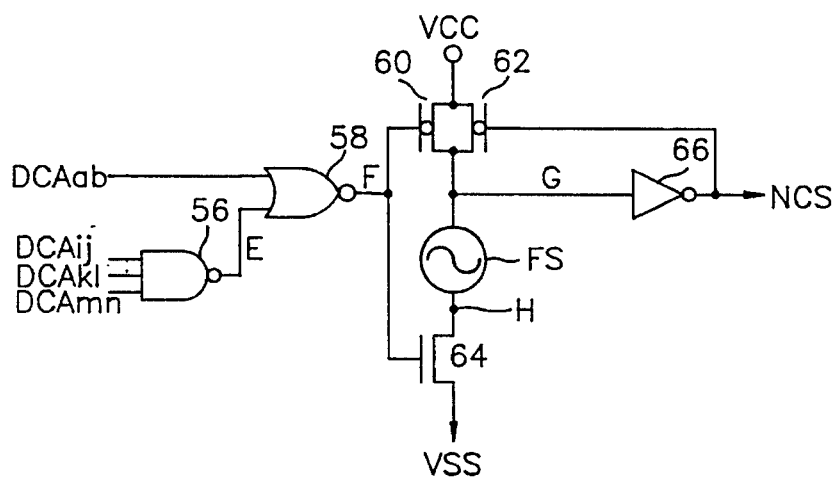
FIG. 6 illustrates the arrangement of the improved normal column selection circuit in accordance with a further embodiment of the present invention.

Turning to FIG. 3, even if the defective column is fused using the fuse FS provided in the NCS circuit portion, the circuit portion does not need the normal column disable signal occurring in response to the output signals FBO0, FBO1, ..., FBON of the fusing boxes. Thus, because it is possible to eliminate the gate passing time necessary for generating the normal column disable signal NCD, a time necessary for enabling the normal selection signal NCS can be shortened. As a result, the gate passing time of the NCS circuit portion according to the present invention can be reduced more than about 40% as compared to the that of the conventional column redundancy circuit. In the NCS circuit of the present invention, the fuse FS is connected between the PMOS transistor 22 and the node "B", but can be located in any position without departing from the spirit of this invention FIG. 6 shows the NCS circuit portion in accordance with another embodiment of the present invention. In FIG. 6, the circuit portion has NAND gate 56 for receiving column decoding signals DCAij, DCAkl and DCAmn, NOR gate 58 for column decoding signal DCAab and the output signal of the NAND gate 56, a pair of PMOS transistors 60 and 62 connected between the source voltage supply VCC and a node "G", a fuse FS connected between the node "G" and a node "H", NMOS transistor 64 having a drain connected to the node "H", a source connected to a ground voltage supply VSS and a gate connected to the output terminal of the NOR gate 58, and an inverter 66 for receiving a signal of the node "G" and generating a normal column selection signal NCS. The output signal of the NOR gate 58 and the normal column selection signal NCS are applied to gates of the PMOS transistors 60 and 62, respectively. It is readily understood with reference to FIG. 3 that the NCS circuit portion of FIG. 6 has the same function as that the NCS circuit portion of FIG. 3, and thus description thereof is omitted.

Figure 7:
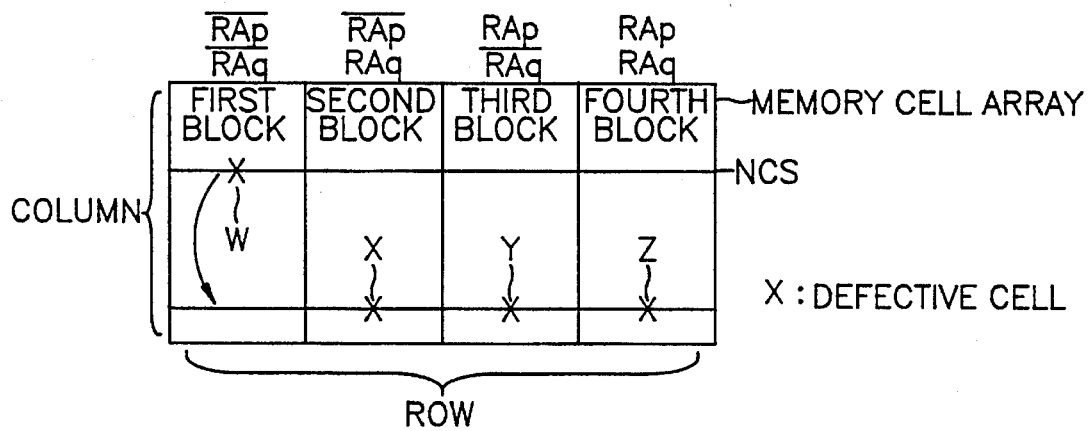
FIG. 7 illustrates a column repairing process on the basis of block designation information.

As shown in FIG. 7, the process for repairing a defective column on the basis of block designating information is illustrated. The normal memory cell array is divided into memory cell array blocks of $2^n$ which can be designated by row address signals of n. For example, if the number of row address signals is eight, the memory cell array can be designated by memory cell array blocks of two hundred and fifty six. In FIG. 7, it is illustrated for brief description that the normal memory cell array is designated by four memory cell array blocks (e.g. a first block, a second block, a third block and a fourth block) on the basis of two row address signals RAp and RAq. The combination of the two row address signals RAp and RAq is ($\overline{RAp}$, $\overline{RAq}$), ($\overline{RAp}$, RAq), (RAp, $\overline{RAq}$), or (RAp, RAq). Suppose that a defective cell W is within the first block, but not within the other blocks, in normal column. Also, suppose that a defective cell is not the first block, but defective cells X, Y and Z is within the other blocks, respectively, in redundant column. If row address signal as block designating information is used, the redundant column where the defective cell exists can not be used. However, if the redundant column is set only in case of selecting the first block by the row address signals RAp and RAq, the redundant column is disabled in case of selecting the second, third and fourth blocks, and thus the normal column is set, the redundant columns where the defective cells X, Y and Z exist can be used. As a result, repairing efficiency can be largely increased.

Figure 8:
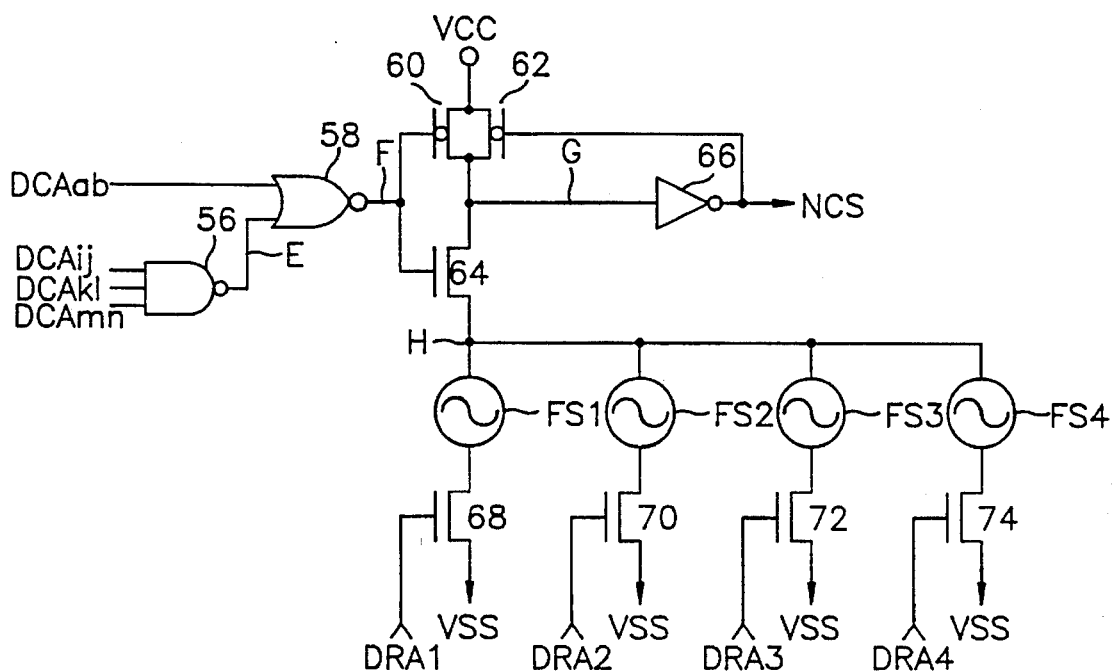
FIG. 8 illustrates the arrangement of the improved normal column selection circuit utilizing block designation information in accordance with another embodiment of the present invention.

FIG. 8 shows the NCS circuit portion utilizing the block designating information as shown in FIG. 7. In the circuit portion of FIG. 8, the same components as those in FIG. 6 are indicated by the same reference numerals.

The NCS circuit portion of FIG. 8 has NAND gate 56 for receiving column decoding signals DCAij, DCAkl and DCAmn, NOR gate 58 for column decoding signal DCAab and the output signal of the NAND gate 56, a pair of PMOS transistors 60 and 62 connected between the source voltage supply VCC and a node "G", NMOS transistor 64 having a drain connected to the node "G", a source connected to a node "H" and a gate connected to the output terminal of the NOR gate 58, an inverter 66 for receiving a signal of the node "G" and generating a normal column selection signal NCS, a plurality of fuses FS1 through FS4 connected commonly to the node "H", NMOS transistor 68 connected between the fuse FS1 and a ground voltage supply VSS and having a gate for receiving a row decode signal DRA1, NMOS transistor 70 connected between the fuse FS2 and the ground voltage supply VSS and having a gate for receiving a row decode signal DRA2, NMOS transistor 72 connected between the fuse FS3 and the ground voltage supply VSS and having a gate for receiving a row decode signal DRA3, and NMOS transistor 74 connected between the fuse FS4 and the ground voltage supply VSS and having a gate for receiving a row decode signal DRA4.

Figure 9:
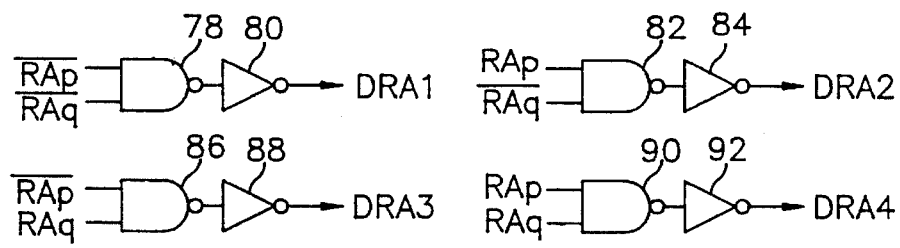
FIG. 9 illustrates the arrangement of the improved row decoder circuit suitable for the normal column selection circuit illustrated in FIG. 8.
Figure 10:
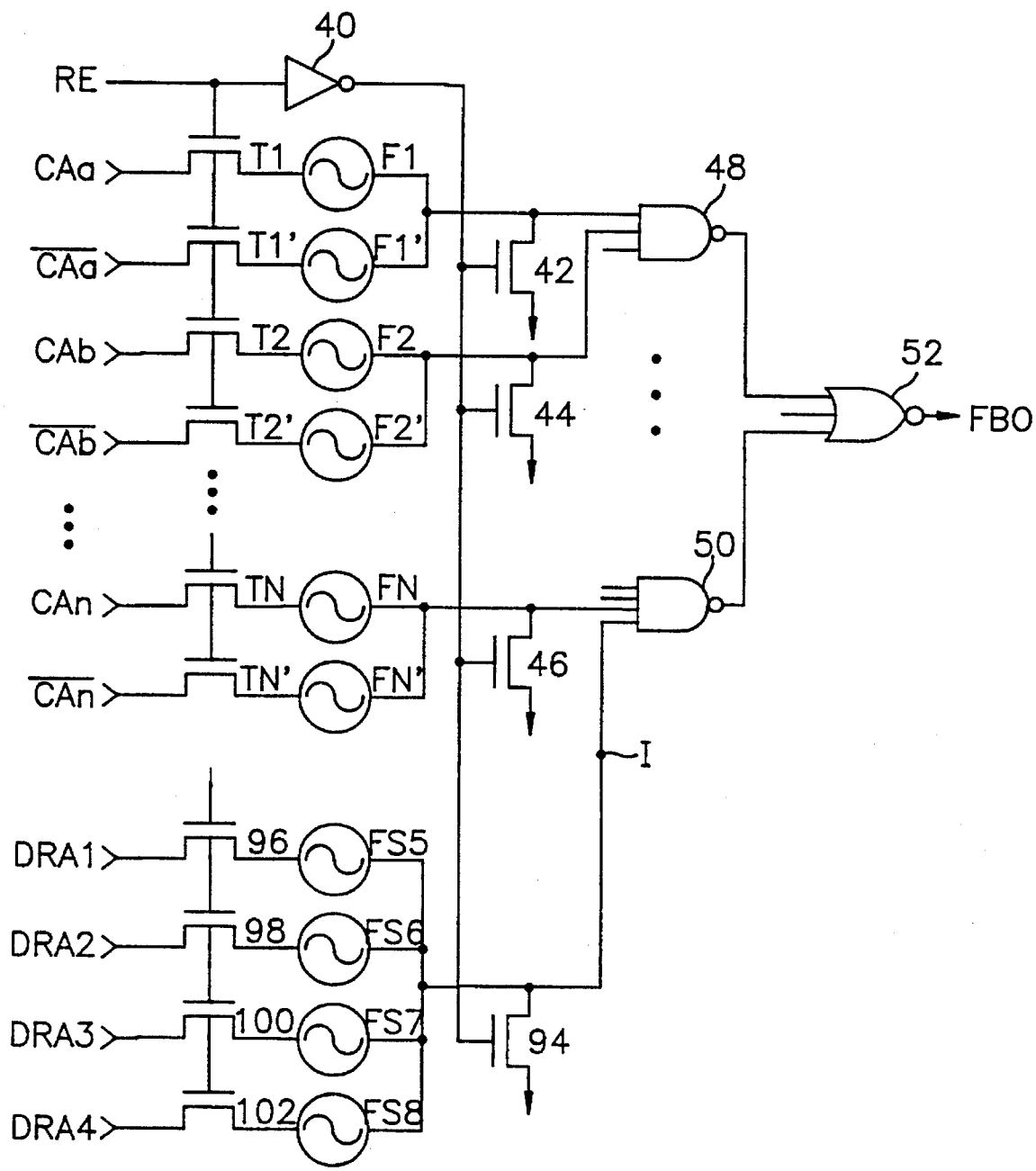
FIG. 10 illustrates the detailed arrangement of the fuse box illustrated in FIG. 7.

FIG. 9 shows the detailed construction of the decoder circuit having a plurality of NAND gates 78, 82, 86, 90 for receiving the address signals ($\overline{RAp}$, $\overline{RAq}$), ($\overline{RAp}$, RAq), (RAp, $\overline{RAq}$), and (RAp, RAq) and a plurality of inverters 80, 84, 86 and 90 for receiving the output signals of the NAND gates and generating row decode signals DRA1 through DRA4. FIG. 10 shows the detailed construction of the fusing box utilizing the block designation information. In FIG. 10, the fusing box further comprises a plurality of NMOS transistors 96 through 102, a plurality of fuses FS5 through FS8 and NAND transistor 94 in addition to the construction of the fusing box of FIG. 2. Each of the NMOS transistors 96 through 102 has a gate for receiving the control signal RE, a first channel terminal for receiving one of the row decode signals DRA1 through DRA4 and a second channel terminal. The fuses FS5 through FS8 are connected between the second channel terminals of the NMOS transistors and the second channel terminal, respectively. The NMOS transistor 94 has a gate for receiving the output signal of the inverter 40 and functions as a discharging transistor.

Hereinafter, the column repairing process in accordance with the block designating information will be described in detail with reference to FIGS. 7 to 10.

Turning again to FIG. 7, suppose that the defective cell W exists within the first block in the normal column and the defective cells X, Y and Z exist within the other blocks, respectively. The normal column selection signal NCS has to be disabled and the redundant column selection signal NCS has to be set, only when the first block is selected by combination of the row address signals RAp and RAq. To enable the redundant column selection signal NCS in the NCS circuit portion of FIG. 7, the fuse FS1 is fused which is connected to the NMOS transistor 68 having the first channel terminal for receiving the row decode signal DRA1 corresponding to the first block, and the other fuses FS2 through FS4 are not fused.

On the other hand, in the fusing boxes of FIG. 10, the fuse FS5 is not fused which is connected to the NMOS transistor 96 having the first channel terminal for receiving the row decoder signal DRA1, and all the other fuses FS6 through FS8 are fused. When the row address signal for designating the defective column address signal corresponding to the defective column and the first block as the defective block is applied, the column decoding signal DCAab is set to be at the low level and the other column decoder signals DCAij, DCAkl, DCAmn are set to be at the high level, thereby allowing the signal level of the node "F" to be set to the high level. Then, the row decode signal DRA1 corresponding to the first block is maintained at the high level, and the other row decode signals DRA2 through DRA3 are maintained at the low level. As a result, the NMOS transistors 64 and 75 are on and the NMOS transistors 70, 72, 74 are off. Also, since the fuse FS1 has been fused, the signal level of the node "G" is not at the low level and is maintained at the high level, thereby allowing the normal column not to be selected by the normal column selection signal NCS of low level.

Additionally, in the fusing box of FIG. 10, since the row decode signal DRA1 corresponding to the first block is at the high level and is connected to the fuse FS5, the node "I" is maintained at the high level. The redundant column selection signal RCS is set to the high level in response to the output signal FBO of the fusing box, thereby allowing the redundant column to be selected. As a result, the redundant cell can be substituted for the defective cell.

If the address signals RAp and RAq corresponding to the second, third and fourth blocks are applied, one of the row decoder signals DRA2 through DRA4 is sol to be at the high level, even if the defective column address signal corresponding to the defective column is applied. Thus, one of the NMOS transistors 70, 72 and 74 is on. Then, since the fuses FS2 through FS5 are not fused and the NMOS transistor 64 is on, the signal level of the node "G" is changed to the low level. As a result, the normal column is selected by the normal column selection signal NCS to be set at the high level.

In the fusing box of FIG. 10, since the row decode signal DRA1 is at the low level and the fuse FS5 is not fused, the signal level of the node "I" is maintained at the low level. Then, the output signal FBO of the fusing box is set to be at the low level and thus the redundant column selection signal RCS is set to be at the low level, thereby allowing the redundant column not to be selected.

As described above, in the column redundancy circuit according to the present invention, to substitute a redundant column for a defective column, the defective column is set to a disable state by fusing a fuse provided in the NCS circuit portion. Also, the normal column is set to a disable state in response to block designating information only when the row address signal corresponding to a memory cell array having a detective cell is applied.

It is understood that various other modifications will be apparent to and can be readily made by those skilled in the art without departing from the scope and spirit of this invention. For example, the fusing box of FIG. 10 is usually called "NAND type fusing box" and can be modified to the NOR type fusing box.

When a redundant column is substituted for a defective column in accordance with the present invention, since the NCS circuit can be operated independently of output signals of fusing boxes provided in an RCS circuit portion, maloperation of column and redundant selection circuits can be prevented and the gate passing time of a signal is shortened so as to achieve a high speed operation of the circuits.

What is claimed is:

1. A semiconductor memory device with redundancy structure having a normal memory cell array having a plurality of normal memory cells arranged in row and column directions and a redundant memory cell array having a plurality of redundant memory cells, said device comprising;

a redundant column selecting circuit for comparing an externally applied column address signal and a programmed defective column address signal to generate a redundant column selection signal, said redundant column selecting circuit having means for producing said programmed defective column address signal by programming a defective column address corresponding to a defective column;

decoding means for decoding said column address signals and producing a column deeming signal; and a normal column selecting circuit for receiving said column decoding signal and producing a normal column selection signal, said normal column selecting circuit having means for disabling said normal column selecting circuit and enabling said redundant column selecting circuit when said defective column address is applied.

2. The semiconductor memory device as defined in claim 1, wherein said means provided in said normal column selecting circuit enables said normal column selecting circuit and disables said redundant column selecting circuit, when column address not corresponding to said defective column is applied.

3. The semiconductor memory device as defined in claim 2, wherein said means provided in said normal column selecting circuit is composed of a fusible fuse.

4. A semiconductor memory device with redundancy structure having a plurality of normal memory cell array blocks each having a plurality of normal memory cells arranged in row and column directions and a redundant memory cell array having a plurality of redundant memory cells so as to substitute at least one of said redundant memory cells for a defective memory cell block having a defective memory cell, said device comprising;

a redundant column selecting circuit for receiving an externally applied column address signal and a block designation row address signal and comparing said externally applied column address signal and said block designation row address signal with a programmed defective column address signal and a programmed defective block designation row address signal, respectively, to generate a redundant column selection signal, said redundant column selecting circuit having means for producing said programmed defective column address signal and said programmed defective block designation row address signal by programming a defective column address corresponding to a defective column and a defective block designation row address for designating said defective memory cell array blocks;

column decoding means for decoding said column address and producing a column decoding signal;

row decoding means for decoding said row address and producing a block designation row address decode signal; and a normal column selecting circuit for receiving said column decoding signals corresponding to each of said block designation row address decode signal and producing a normal column selection signal, said normal column selecting circuit having means responsive to said defective block designation row address decode signal for disabling said normal column selecting circuit and enabling said redundant column selecting circuit when said defective column address and said defective block designation row address are applied.

5. The semiconductor memory device as defined in claim 4, wherein said means provided in said normal column selecting circuit enables said normal column selecting circuit and disables said redundant column selecting circuit, when column address not corresponding to said defective column is applied.

6. The semiconductor memory device as defined in claim 5, wherein said means provided in said normal column selecting circuit is composed of a fusible fuse.

7. A semiconductor memory device with redundancy structure, comprising:

a redundant column selecting circuit; and a normal column selecting circuit;

wherein said normal column selecting circuit has a disabling circuit which disables the normal column selecting circuit and enables the redundant column selecting circuit when a defective column address is applied.

8. The semiconductor memory device as defined in claim 7, wherein said redundant column selecting circuit compares an externally applied column address signal and a programmed defective column address signal to generate a redundant column selection signal, said redundant column selecting circuit having a section which produces the programmed signal by programming a defective column address corresponding to a defective column.

9. The semiconductor memory device as defined in claim 7, further comprising a decoding circuit for decoding address signals and producing a column decoding signal, and wherein said normal column selecting circuit receives said column decoding signal to produce a normal column selection signal.

* * * * *